US012633894B2

(12) United States Patent
Kuwahara

(10) Patent No.: US 12,633,894 B2
(45) Date of Patent: May 19, 2026

(54) ELASTIC WAVE DEVICE, MODULE

(71) Applicant: Sanan Japan Technology Corporation, Tokyo (JP)

(72) Inventor: Eiji Kuwahara, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 912 days.

(21) Appl. No.: 17/933,562

(22) Filed: Sep. 20, 2022

(65) Prior Publication Data

US 2023/0101605 A1    Mar. 30, 2023

(30) Foreign Application Priority Data

Sep. 24, 2021    (JP) ................................. 2021-155157

(51) Int. Cl.
| | |
|---|---|
| *H03H 9/05* | (2006.01) |
| *H03H 3/08* | (2006.01) |
| *H03H 9/02* | (2006.01) |
| *H03H 9/64* | (2006.01) |

(52) U.S. Cl.
CPC .............. *H03H 9/059* (2013.01); *H03H 3/08* (2013.01); *H03H 9/02992* (2013.01); *H03H 9/6483* (2013.01)

(58) Field of Classification Search
CPC ....... H03H 9/059; H03H 3/08; H03H 9/02992

USPC ...... 310/313 R, 313 A, 313 B, 313 C, 313 D
See application file for complete search history.

(56) References Cited

U.S. PATENT DOCUMENTS

| | | | |
|---|---|---|---|
| 2010/0117483 A1* | 5/2010 | Tanaka ............... | H03H 9/02992 310/313 B |
| 2012/0194033 A1* | 8/2012 | Tsuda ................... | H03H 9/0057 310/313 C |
| 2019/0326878 A1* | 10/2019 | Kakita ................. | H03H 9/6483 |

FOREIGN PATENT DOCUMENTS

WO        2011089906 A1      7/2011

* cited by examiner

*Primary Examiner* — Derek J Rosenau
(74) *Attorney, Agent, or Firm* — Dorsey & Whitney LLP

(57) ABSTRACT

An elastic wave device includes a wiring board, a device chip having a resonator, and a wiring pattern electrically connected to the resonator, the device chip is electrically connected to the wiring board, and a sealing portion that seals the device chip. The wiring pattern includes a first wiring layer and a second wiring layer. The second wiring layer includes a lower metal layer in contact with an upper surface of the first wiring layer, a partition layer which is a metal layer in contact with an upper surface of the lower metal layer, and an upper metal layer in contact with an upper surface of the partition layer. The partition layer is a metal having a lower electrical conductivity than the lower metal layer and the upper metal layer.

15 Claims, 15 Drawing Sheets

FIG.5
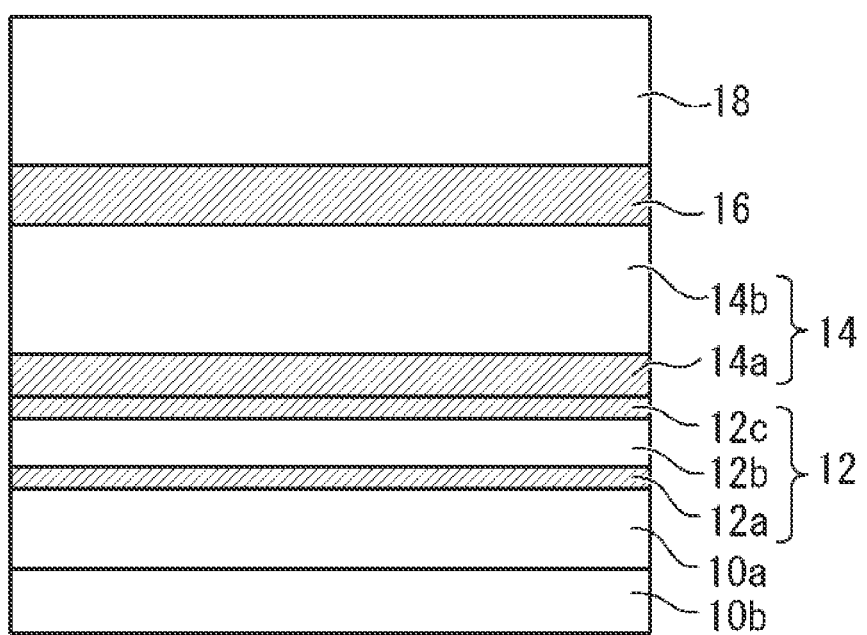
FIG.6A        FIG.6B
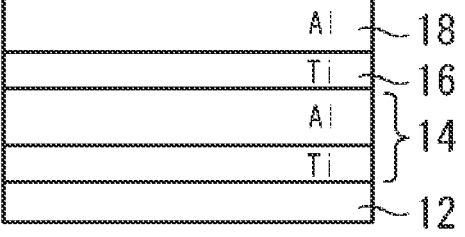 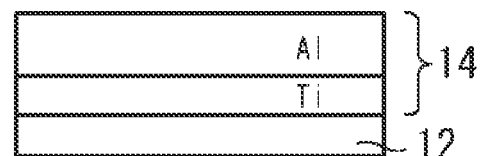

FIG.7

| UNIT(nm) | FIRST WIRING LAYER (IDT) (12) | | | SECOND WIRING LAYER | | | | | |
|---|---|---|---|---|---|---|---|---|---|
| | Ti | AlCu | Ti | Ti (14) | Al (14) | Ti (16) | Ti (16) | Ti (18) | Al (18) |
| COMPARATIVE EXAMPLE 1 | 15 | 120 | 15 | 100 | 1500 | - | - | - | - |
| COMPARATIVE EXAMPLE 2 | 15 | 120 | 15 | 100 | 4000 | - | - | - | - |
| EXAMPLE 1 | 15 | 120 | 15 | 100 | 2000 | - | 10 | 100 | 2000 |
| EXAMPLE 2 | 15 | 120 | 15 | 100 | 2000 | - | 15 | 100 | 2000 |
| EXAMPLE 3 | 15 | 120 | 15 | 100 | 2000 | - | 20 | 100 | 2000 |
| EXAMPLE 4 | 15 | 120 | 15 | 100 | 2000 | - | 50 | 100 | 2000 |

ELASTIC WAVE DEVICE, MODULE

CROSS REFERENCE TO RELATED APPLICATION(S)

This application claims priority to Japanese Patent Application No. 2021-155157 filed Sep. 24, 2021, The aforementioned application is incorporated herein by reference, in its entirety, for any purpose.

BACKGROUND

Field

The present disclosure relates to an elastic wave device and a module comprising the elastic wave device.

Background Art

Patent Document 1 (WO2011/089906) discloses an elastic wave device. The elastic wave device can be provided as a high frequency filter having a passband frequency in the range of tens of MHz to several GHz. The elastic wave device includes a piezoelectric substrate, a comb-shaped electrode provided on an upper surface of the piezoelectric substrate, a first wiring provided on the upper surface of the piezoelectric substrate, an organic insulator covering at least a portion of the first wiring, a second wiring provided on a first portion of an upper surface of the organic insulator, and an inorganic insulator covering at least a second portion of the upper surface of the organic insulator. An excitation space for exciting the piezoelectric substrate is formed above the comb-shaped electrode, and the second portion of the upper surface of the organic insulator faces the excitation space via the inorganic insulator.

The quality improvement of wiring structure is desired. For example, low loss, high reliability, and high durability wiring structure is required.

SUMMARY

The present disclosure has been made to solve the above-described problems. An object of the present disclosure is to provide an elastic wave device having a wiring structure with enhanced quality, and a module having the elastic wave device.

In some examples, an elastic wave device includes a wiring board, a device chip having a resonator, and a wiring pattern electrically connected to the resonator, the device chip is electrically connected to the wiring hoard, and a sealing portion that seals the device chip. The wiring pattern includes a first wiring layer and a second wiring layer, the second wiring layer includes a lower metal layer in contact with an upper surface of the first wiring layer, a partition layer which is a metal layer in contact with an upper surface of the lower metal layer, and an upper metal layer in contact with an upper surface of the partition layer. The partition layer is a metal having a lower electrical conductivity than the lower metal layer and the upper metal layer.

BRIEF DESCRIPTION OF THE DRAWINGS

FIG. 5 is a sectional view showing an example of the wiring pattern;

FIG. 6A is a cross-sectional view of the wiring pattern of Examples;

FIG. 6B is a cross-sectional view of the wiring pattern structure according to Comparative Examples;

FIG. 7 is a table showing the wiring patterns of Examples and Comparative Examples;

DETAILED DESCRIPTION

Figure 1:
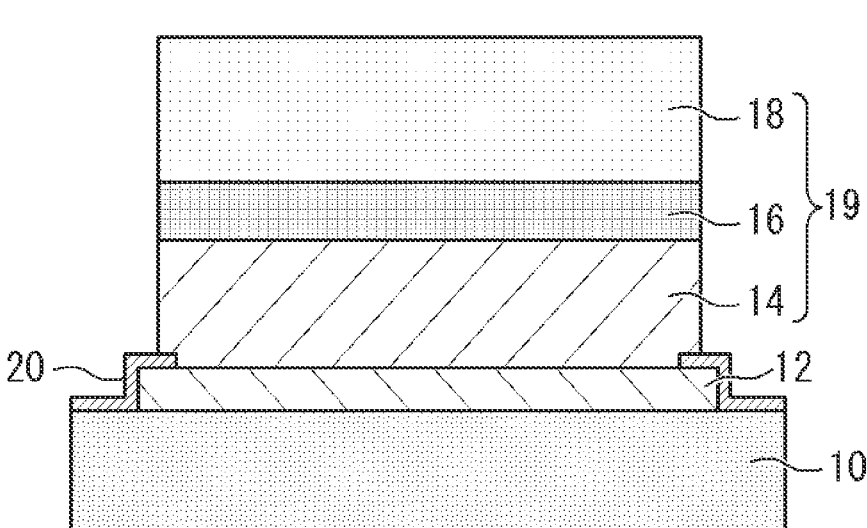
FIG. 1 illustrates a cross-sectional view of a wiring pattern.

Embodiments will be described with reference to the accompanying drawings. In the drawings, the same or corresponding parts are denoted by the same reference numerals. Duplicate descriptions of such portions may be simplified or omitted.

Embodiment 1

FIG. 1 is a cross-sectional view of a wiring pattern portion of an elastic wave device according to the Embodiment 1. According to one example, the representation of "a wiring pattern" or "a wiring layer" means an interconnect. On a piezoelectric substance 10, a wiring pattern having a first wiring layer 12 and a second wiring layer 19 is formed. The first wiring layer 12 has a single metal layer or multiple metal layers. The second wiring layer 19 includes a lower metal layer 14 in contact with an upper surface of the first wiring layer 12, a partition layer 16 which is a metal layer in contact with an upper surface of the lower metal layer 14, and an upper metal layer 18 in contact with an upper surface of the partition layer 16. According to one example, the lower metal layer 14 comprises a single or multiple metal layers, and the upper metal layer 18 also comprises a single or multiple metal layers. In the example of FIG. 1, a width of the second wiring layer 19 is smaller than a width of the first wiring layer 12. According to one example, the total thickness of the lower metal layer 14 and the upper metal layer 18 may be 6 to 70 times the thickness of the first wiring layer 12.

The partition layer 16 is a metal layer formed between the lower metal layer 14 and the upper metal layer 18. According to one example, the partition layer 16 is a metal having a lower electrical conductivity than the lower metal layer 14 and the upper metal layer 18. According to another example, the partition layer 16 is a metal having a lower electrical conductivity than the first wiring layer 12, the lower metal layer 14 and the upper metal layer 18. For example, the partition layer 16 is formed of any one or at least two selected from Ti, Mn, Pd, Cr, Pt, and Sn. Then, the lower metal layer 14 and the upper metal layer 18 include any one or at least two selected from Ag, Cu, Au, Al, Be, and W. According to another example, the partition layer 16 is a metal having an electrical conductivity of $10 \times 10^6$ S/m or less, and the lower metal layer 14 and the upper metal layer 18 include a metal having an electrical conductivity of $20 \times 10^6$ S/m or more. According to one example, the partition layer 16 is in contact with a portion of the lower metal layer 14 having an electrical conductivity of $20 \times 10^6$ S/m or more and a portion of the upper metal layer 18 having an electrical conductivity of $20 \times 10^6$ S/m or more. Also, the first wiring layer 12 may include a metal having an electrical conductivity of $20 \times 10^6$ S/m or more.

According to one example, in order to electrically insulate the wiring pattern with adjacent conductors, an insulating layer 20 is formed. The Insulating layer 20 is an insulator. In the example of FIG. 1, the insulating layer 20 is formed on the piezoelectric substance 10, a side surface of the first wiring layer 12, and a portion of the upper surface of the first wiring layer 12.

Figure 2:
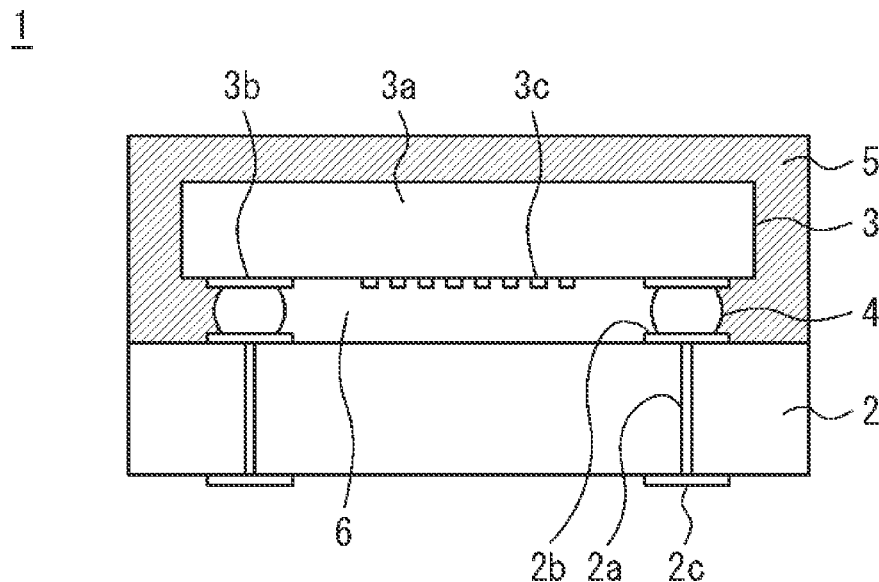
FIG. 2 is a cross-sectional view showing a configuration example of an elastic wave device.

FIG. 2 is a cross-sectional view showing a configuration example of an elastic wave device. The elastic wave device 1 includes a wiring board 2. According to an example, the wiring board 2 is a multilayer board including a resin. According to another example, the wiring board 2 is a Low Temperature Co-fired Ceramics (LTCC) multilayer substrate made of a plurality of dielectric layers. A passive element such as a capacitor or an inductor may be formed inside the wiring board 2.

In the example of FIG. 2, the wiring board 2 is provided with a plurality of conductive pads 2b, The plurality of conductive pads 2b are provided on an upper surface of the wiring board 2. Accordingly, the upper surface of the wiring board 2 serves as a component mounting surface. A lower surface of the wiring board 2 is, for example, a mounting surface to a mother substrate. A plurality of conductive pads 2c are provided on a lower surface of the wiring board 2. The conductive pads 2b and the conductive pads 2c corresponding to each other are connected by an inner conductor 2a or via hole conductor.

Above the wiring board 2, there is a device chip 3 which is electrically connected to the wiring board 2, The device chip 3 is, for example, a surface acoustic wave device chip. The device chip 3 is provided with a piezoelectric substrate 3a formed of a piezoelectric material. The piezoelectric substrate 10 described above is a part of the piezoelectric substrate 3a. According to an example, the piezoelectric substrate 3a is a substrate formed of a piezoelectric single crystal such as lithium tantalate, lithium niobate or quartz. According to another example, the piezoelectric substrate 3a is a substrate for tied of piezoelectric ceramics. According to yet another example, the piezoelectric substrate 3a is a substrate to which the piezoelectric substrate and a support substrate are bonded. The support substrate is, for example, a substrate formed of sapphire, silicon, alumina, spinel, quartz, or glass.

According to an example, the piezoelectric substrate 3a is a substrate on which the functional element is formed. For example, a receiving filter and a transmission filter are formed on a main surface (a lower surface) of the device chip 3. The main surface faces the wiring board 2.

The receiving filter is formed so that an electrical signal in a desired frequency band can pass. For example, the receiving filter is a ladder-type filter consisting of a plurality of series resonators and a plurality of parallel resonators.

The transmission filter is formed so that an electrical signal in a desired frequency band can pass. For example, the transmission filter is a ladder-type filter consisting of a plurality of series resonators and a plurality of parallel resonators.

In the example of FIG. 2, a wiring pattern 3b and a plurality of electrodes 3c formed periodically are formed on the main surface of the device chip 3. According to an example, the plurality of electrodes 3c are Interdigital Transducer (IDT) electrodes, which are comb-shaped electrode fingers. Surface acoustic waves are excited by applying a high frequency electric field to the IDT electrodes through a wiring pattern from the lead terminal on the power supply side. Filter characteristics can be obtained by converting the surface acoustic waves into high frequency electric fields by piezoelectric action.

The wiring pattern 3b and the conductive pad 2b are electrically connected by a hump 4. The hump 4 is, for example, Au, a conductive adhesive or solder.

The elastic wave device 1 includes a sealing portion 5. According to one example, the sealing portion 5 is a resin that seals the device chip 3 while leaving a space 6 between the wiring hoard 2 and the device chip 3. According to an example, the device chip 3 is mounted on the wiring hoard 2. Subsequently, a resin sheet is placed on the device chip 3. For example, the resin sheet is prepared by forming liquid epoxy resin into a sheet. According to another example, the resin sheet may be a synthetic resin such as poly imide different from an epoxy resin. A protective film made of polyethylene terephthalate (PET) can be provided on an upper surface of the resin sheet. A base film made of polyester can be provided on a lower surface of the resin sheet. By placing the resin sheet on the device chip 3, the resin sheet is temporarily fixed to the device chip 3. Thereafter, the resin sheet is heated to a softening temperature to fill the side surface of the device chip 3 and the upper surface of the wiring board 2 with the resin sheet. This is called the heated roller lamination method. Thereafter, the resin sheet is heated to a curing temperature of the resin to completely cure.

According to one example, the device chip 3 has a plurality of resonators. The plurality of resonators can be a surface acoustic wave resonator. In this case, the device chip 3 can function as a band-pass filter or a duplexer.

Figure 3:
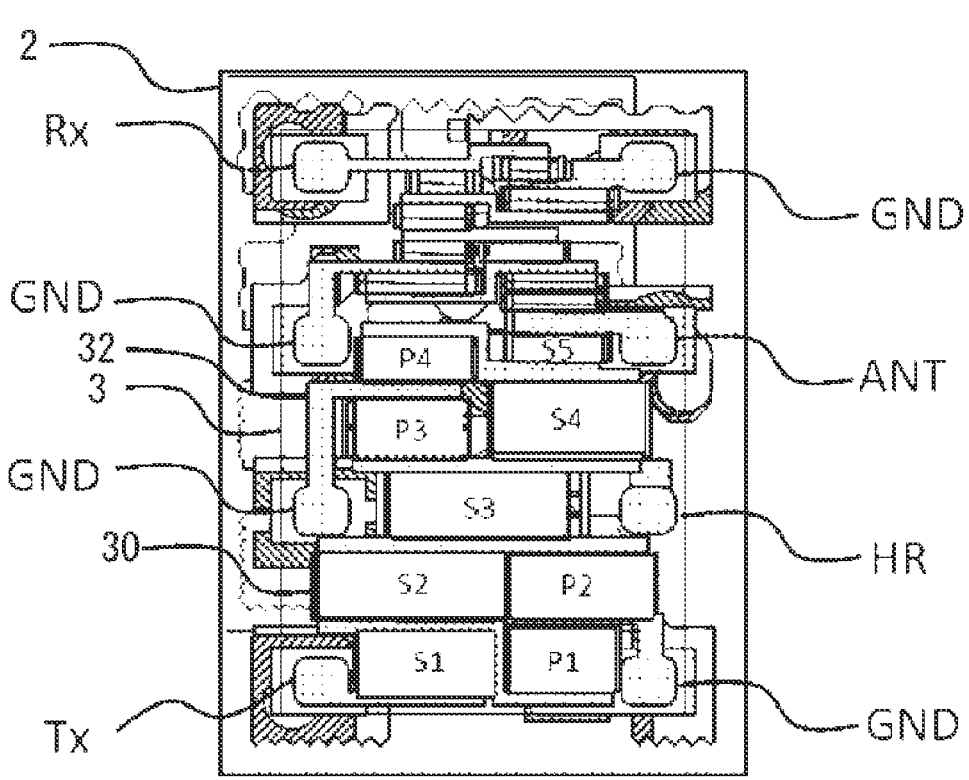
FIG. 3 is a plan view showing a configuration example of a device chip.

FIG. 3 is a plan view showing a configuration example of the device chip 3 and the wiring board 2. As shown in FIG. 3, a plurality of elastic wave elements 30 and a plurality of wiring patterns 32 are formed on the main surface of the device chip 3. The plurality of elastic wave elements 30 includes a plurality of series resonators S1, S2, S3, S4, S5 and a plurality of parallel resonators P1, P2, P3, P4.

According to one example, the plurality of series resonators S1, S2, S3, S4, S5 and the plurality of parallel resonators P1, P2, P3, P4 are formed so as to function as a transmission filter, A receiving filter having other series resonators and other parallel resonators may be formed in the device chip 3.

In one example, the wiring patterns 32 are formed of a suitable metal or alloy such as silver, aluminum, copper, titanium, palladium, or the like. According to one example, at least a portion of the wiring patterns 32 has the wiring pattern structure of FIG. 1. According to another example, all the wiring patterns 32 have the wiring pattern structure of FIG. 1. The thickness of the wiring patterns 32 is, for example, 1500 nm to 4500 nm.

The wiring patterns 32 are electrically connected to respective elastic wave elements 30. The wiring patterns 32 include an antenna bump pad ANT, a transmission bump pad Tx, a receiving bump pad Rx and four ground bump pads GND. These bump pads are portions that are electrically connected to the bumps when they are mounted. The wiring patterns 32 includes not only these hump pads, but also wiring portions connecting the bump pads and the elastic wave elements 30.

Figure 4:
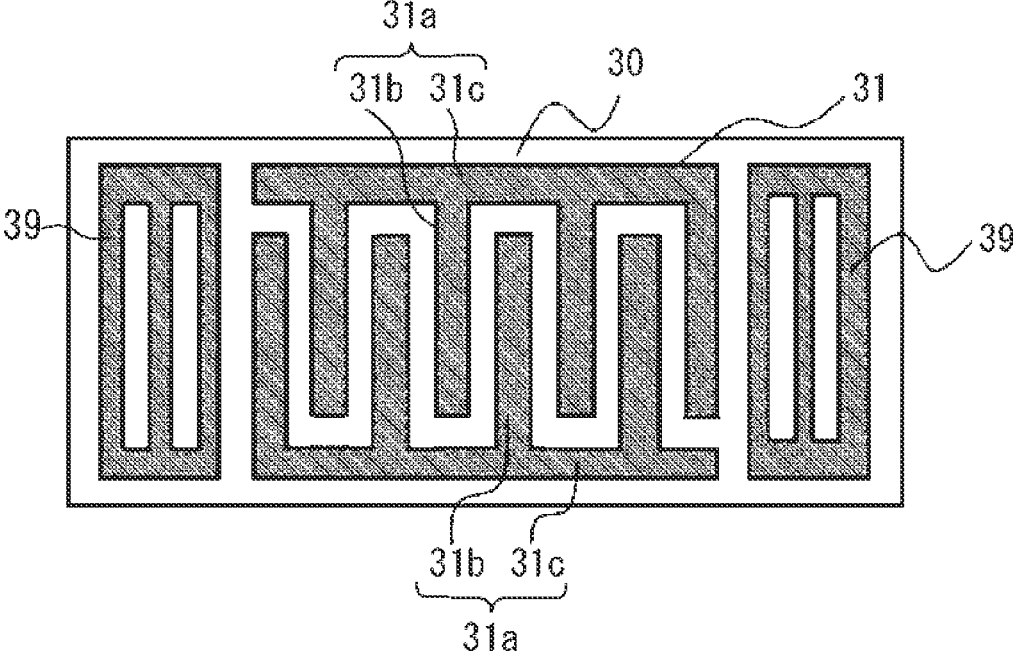
FIG. 4 is a plan view showing an example of elastic wave elements.

FIG. 4 is a diagram showing an example of one of the elastic wave elements 30, As shown in FIG. 4, an IDT31 and a pair of reflectors 39 are formed on a main surface of the device chip 3. The IDT 31 and the pair of reflectors 39 are provided so as to excite surface-acoustic waves.

According to one example, the IDT31 and the pair of reflectors 39 are formed of aluminium-copper alloys. According to another example, the IDT31 and the pair of reflectors 39 are formed of titanium, palladium, silver or alloys thereof. According to still another example, the IDT31 and the pair of reflectors 39 are formed by a laminated metal film in which a plurality of metal layers are laminated. The IDT31 and the pair of reflectors 39 may be formed of different materials. For example, Ti may be added to the upper and lower surfaces of the materials described above. According to one example, the thickness of the IDT31 and the pair of reflectors 39 is between 150 nm and 400 nm.

The IDT 31 includes a pair of comb-shaped electrodes 31a. The pair of comb-shaped electrodes 31a are opposed to each other. Each of the comb-shaped electrodes 31a includes a plurality of electrode fingers 31h and a bus bar 31c. The plurality of electrode fingers 31b are arranged in its longitudinal direction. The bus bar 31c connects the plurality of electrode fingers 31b. When viewed in plan, the IDT31 is sandwiched between the pair of reflectors 39. According to one example, the IDT31 and the pair of reflectors 39 can be the same material as the first wiring layer 12 of FIG. 1. In that case, the IDT31, the pair of reflectors 39 and the first wiring layer 12 are deposited and patterned in the same process.

According to one example, such a SAW (Surface Acoustic Wave) resonator is electrically connected to the wiring pattern. Further, the device chip is electrically connected to the wiring board. The input signal from the wiring board is filtered by the device chip and outputs to the wiring board.

FIG. 5 is a sectional view showing an example of the wiring pattern. The first wiring layer 12 has a structure in which a Ti layer 12a, an AlCu layer 12b and a Ti layer 12c are stacked in the order presented. The lower metal layer 14 has a structure in which a Ti layer 14a and an Al layer 14h are stacked in the order presented. In this example, the partition layer 16 is made of Ti. The upper metal layer 18 is made of Al.

According to an example, the wiring pattern may be formed on a substrate having a piezoelectric substrate 10a and a substrate 10b. The substrate 10b is in contact with the lower surface of the piezoelectric substrate 10a. According to one example, a resonator and the wiring pattern are formed on the upper surface of the piezoelectric substrate 10a. The substrate 10b is made of, for example, sapphire, silicon, alumina, spinel, quartz, or glass. In the example of FIG. 5, the device chip comprises the piezoelectric substrate 10a and the substrate 10b.

Examples and Comparative Examples will be described with reference to FIGS. 6A-13. FIG. 6A is a cross-sectional view of the wiring pattern of Examples. FIG. 6B is a cross-sectional view of the wiring pattern structure according to Comparative Examples. FIG. 6A shows the wiring pattern having the first wiring layer 12, a Ti layer, an Al layer, a Ti layer, and an Al layer. Specifically, the Ti layer, the Al layer, the Ti layer, and the Al layer are formed in this order on the first wiring layer 12. FIG. 6B shows the wiring pattern structure having the first wiring layer 12, a Ti layer, and an Al layer. The Ti layer and the Al layer are formed in this order on the first wiring layer 12. In both Examples (FIG. 6A) and Comparative Examples (FIG. 6B), the first wiring layer 12 has a Ti layer, a AlCu layer, and a Ti layer on top of the piezoelectric substrate. In other words, in both Examples (FIG. 6A) and Comparative Examples (FIG. 6B), the first wiring layer 12 has the same layer structure as the IDT.

FIG. 7 is a table showing the layer thicknesses of the respective layers of Examples and Comparative Examples. In Comparative Example 1, a thickness of the outermost Al layer is 1500 nm, whereas in Comparative Example 2, a thickness of the outermost Al layer is 4000 nm. The partition layers 16 of Examples 1-4 are different in thickness. A thickness of the partition layer 16 is 110 nm in Example 1, 115 nm in Example 2, 120 nm in Example 3, and 150 nm in Example 4.

Figure 8:
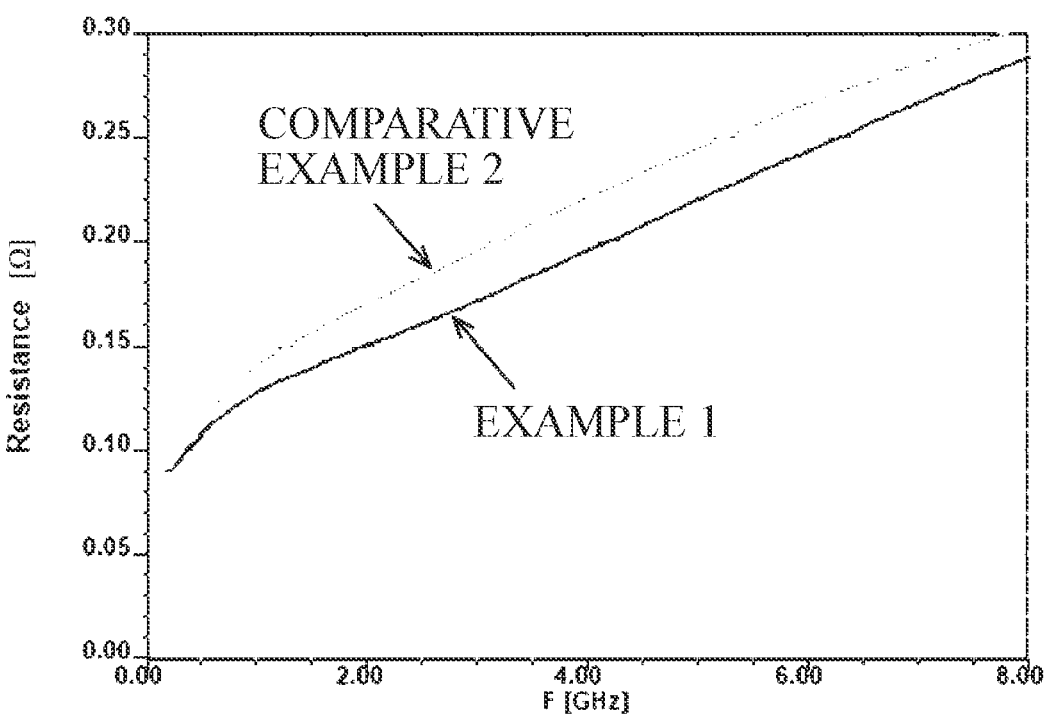
FIG. 8 is a graph showing simulation results of high-frequency resistance values.

FIG. 8 is a graph showing simulation results of high-frequency resistance values of Example 1 and Comparative Example 2. FIG. 8 shows that the high-frequency resistance value of Example 1 is lower than the high-frequency resistance value of the Comparative Example 2 at any frequency from 0.5 GHz to 8 GHz. Therefore, the wiring structure of Example 1 has less wiring loss than that of Comparative Example 2 and is suitable as a wiring of a high-frequency device.

Figure 9:
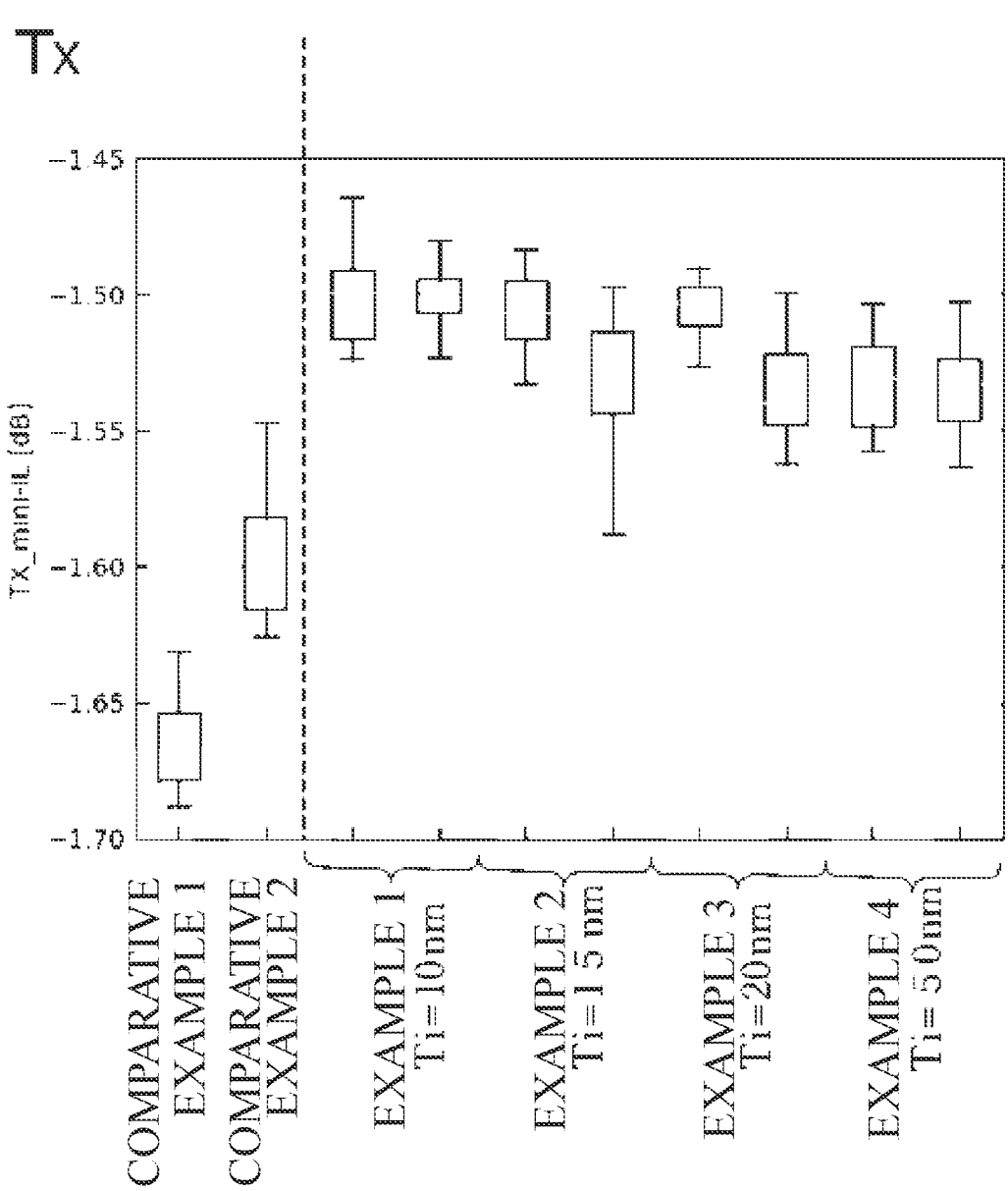
FIG. 9 shows measurement results of the attenuation amount of a transmission signal.

FIG. 9 shows measurement results of the attenuation amount of a transmission signal for Comparative Examples and Examples. Twenty-one samples were prepared for each of the wiring structures of Comparative Examples 1 and 2 and Examples 1 to 4. The attenuation of the transmission signal was measured for these samples and is shown in FIG. 9. From FIG. 9, it can be seen that the signal loss can be suppressed more in Comparative Example 2 than in Comparative Example 1. Therefore, the signal loss can be suppressed by thickening the Al layer of the lower metal layer 14. Further, it is understood that the wiring structure of Examples 1 to 4 has less signal loss than that of Comparative Examples 1 and 2. Therefore, thickening the second wiring layer by providing the partition layer 16 and the upper metal layer 18 can suppress attenuation of the transmission signal compared to simply thickening the Al layer of the lower metal layer 14 as in Comparative Example 2. Comparing Examples 1-4, there was a tendency that Example 1 had the smallest signal loss, Example 2 had a larger signal loss than Example 1, Example 3 had a larger signal loss than Example 2, and Example 4 had a larger signal loss than Example 3, Therefore, as a wiring pattern for reducing the loss of the transmission signal, it is considered to be effective to reduce the thickness of the partition layer 16.

Figure 10:
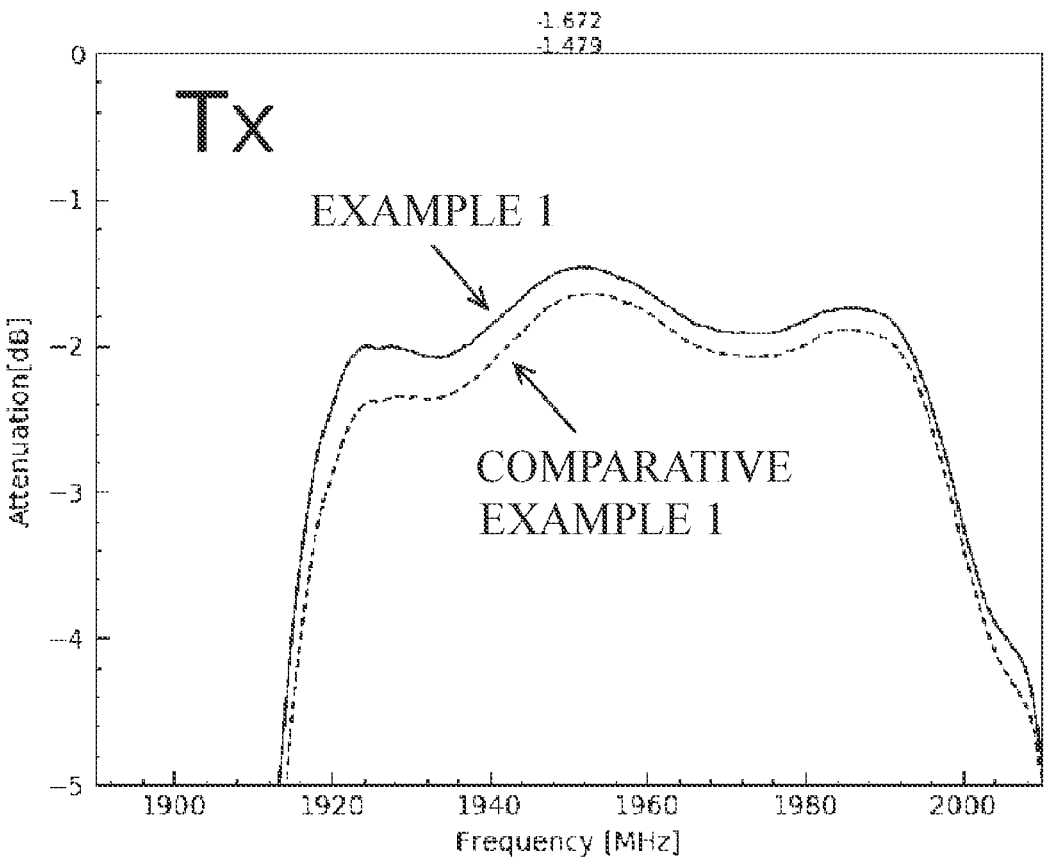
FIG. 10 shows a relationship between a frequency and the attenuation of the transmission signal.

FIG. 10 is a diagram showing a relationship between a frequency and the attenuation of the transmission signal. FIG. 10 shows the frequency dependence of the attenuation of the transmission signal for Comparative Example 1 and Example 1. It can be seen from FIG. 10 that the wiring structure of Example 1 has less attenuation of the transmission signal at any frequency compared to the wiring structure of Comparative Example 1.

Figure 11:
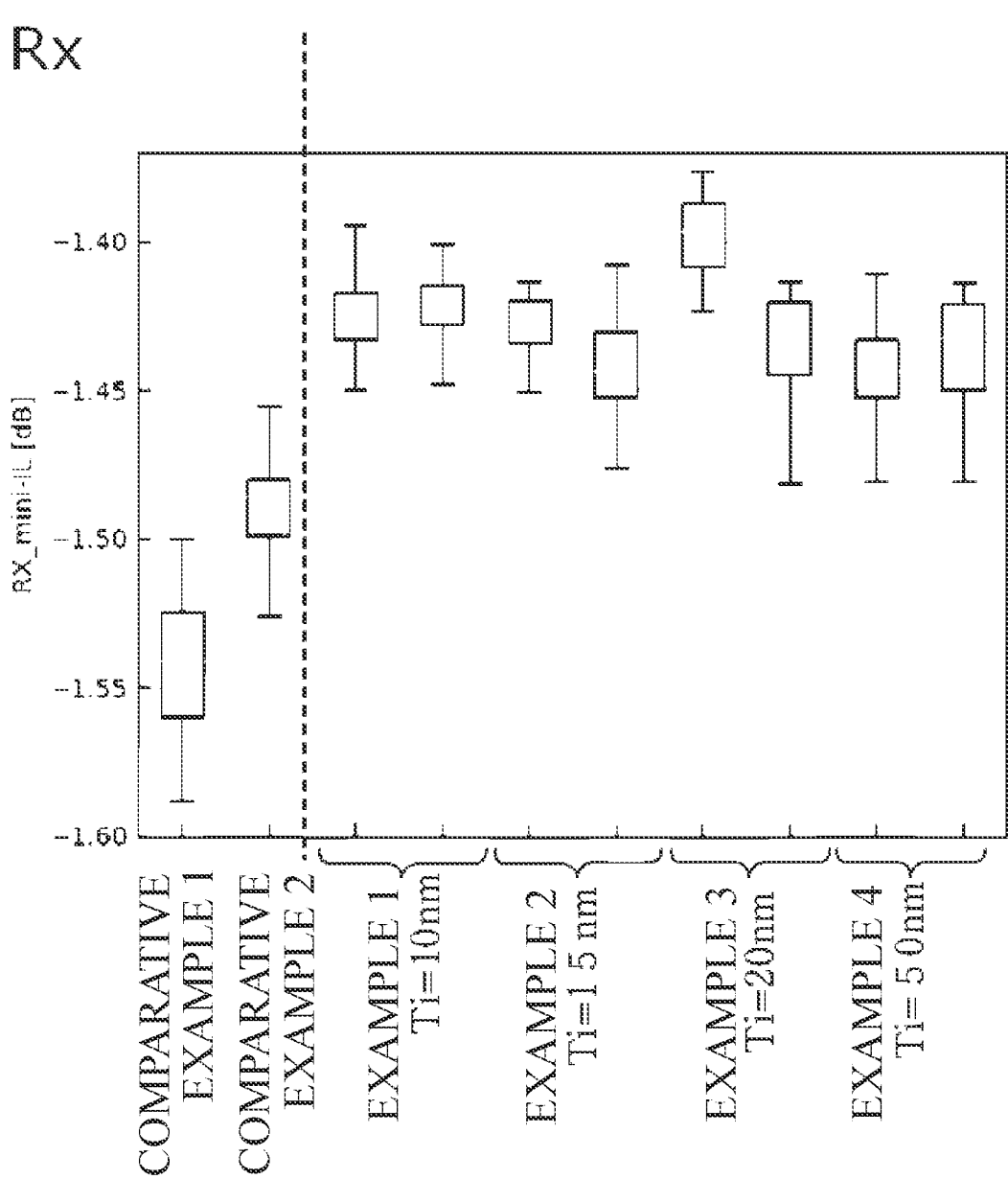
FIG. 11 shows measurement results of the attenuation amount of a received signal.

FIG. 11 shows measurement results of the attenuation amount of a received signal for Comparative Examples and Examples. Twenty-one samples were prepared for each of the wiring structures of Comparative Examples 1 and 2 and Examples 1 to 4. The attenuation of the received signal was measured for these samples and is shown in FIG. 11. From FIG. 11, it can be seen that the signal loss can be suppressed more in Examples 1-4 than in Comparative Examples 1, 2. Further, it is understood that the wiring structure of Comparative Example 2 has less signal loss than that of Comparative Example 1. Therefore, the signal loss can be suppressed by thickening; the Al layer of the lower metal layer 14. However, thickening the second wiring layer by providing the partition layer 16 and the upper metal layer 18 can suppress attenuation of the received signal compared to simply thickening the Al layer of the lower metal layer 14 as in Comparative Example 2.

Figure 12:
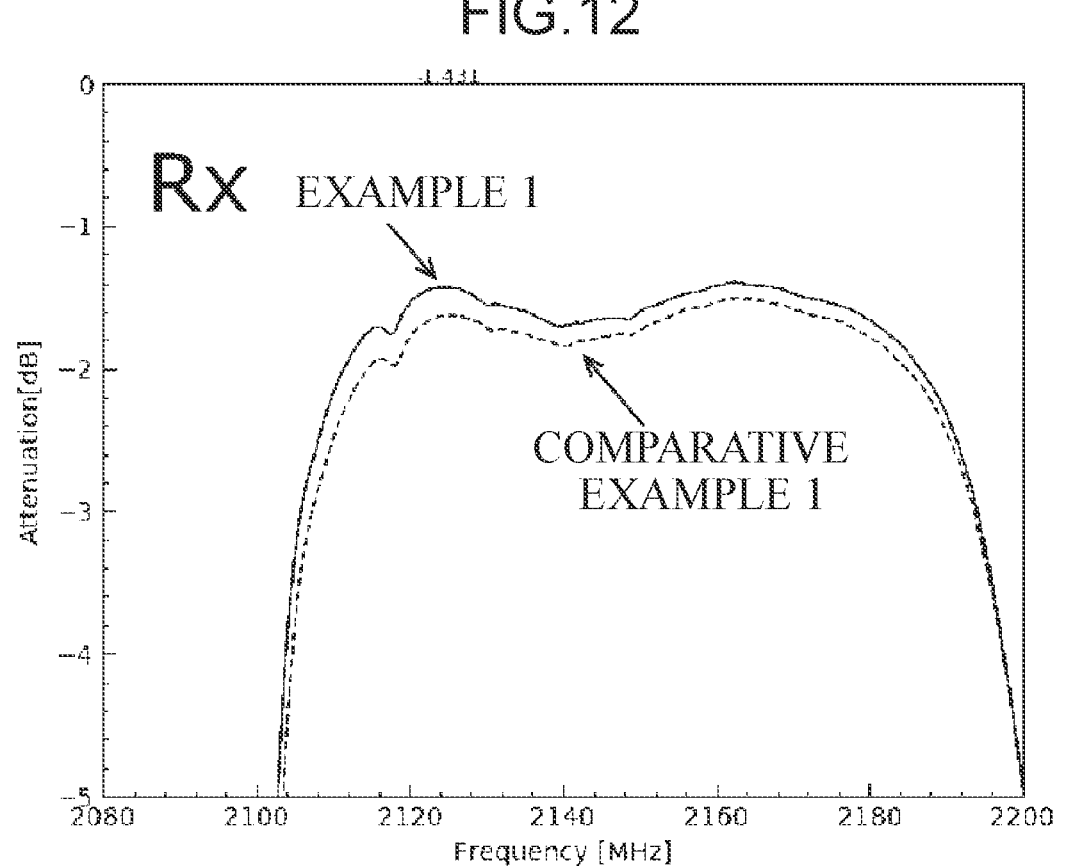
FIG. 12 is a diagram showing a relationship between a frequency and the attenuation of the received signal.

FIG. 12 is a diagram showing a relationship between a frequency and the attenuation of the received signal. FIG. 12 shows the frequency dependence of the attenuation of the received signal for Comparative Example 1 and Example 1. It can be seen from FIG. 12 that the wiring structure of Example 1 has less attenuation of the received signal at any frequency compared to the wiring structure of Comparative Example 1.

Figure 13:
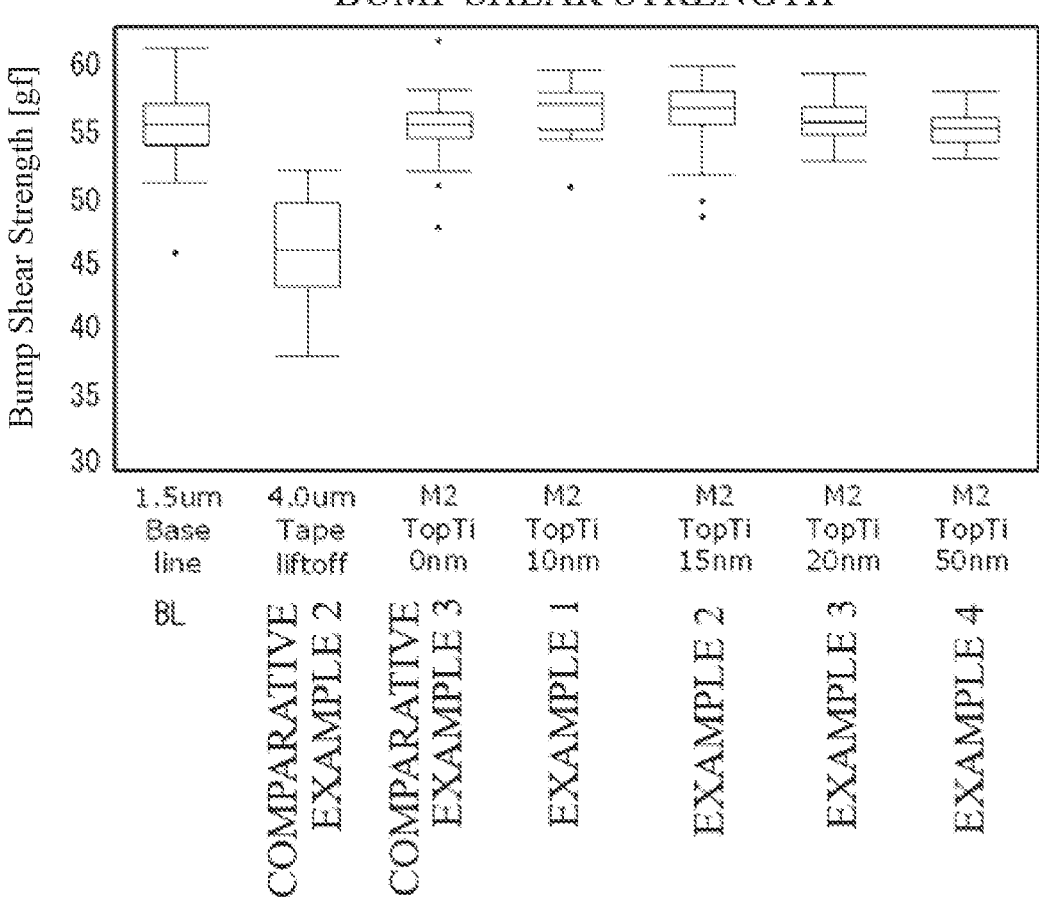
FIG. 13 is a diagram showing results of a bump shear strength test.

FIG. 13 is a diagram showing results of a bump shear strength test of the bumps. First, a bump is formed on the wiring pattern. The bump shear strength test was then performed to test the bonding properties of the bumps. The sample that gave the leftmost result in FIG. 13 is a baseline (BL: reference) sample (hereinafter referred to as a BL sample). The BL sample is a sample in which an Al layer having a thickness of 1.5 μm is used as a wiring pattern and humps are funned thereon. From FIG. 13, it can be seen that in the BL sample, since the wiring pattern is thin, the shear strength is relatively good.

In the case of Comparative Example 2, the lower metal layer 14 includes an Al layer having a thickness of 4.0 μm. In this case, the bump shear strength deteriorated as compared with other samples. Comparative Example 3 is a wiring pattern similar to the wiring pattern of Example 1 of FIG. 7. But Comparative Example 3 is different from the wiring structure of Example 1 of FIG. 7 in that a part of the partition layer 16 contacting the lower metal layer 14 (i.e. Ti layer of 10 nm) is omitted. Therefore, the wiring patterns of Comparative Example 3 and Examples 1 to 4 differ in the thickness of the Ti layer of the partition layer 16. When the thicknesses of the partition layers 16 are arranged in ascending order, Comparative Example 3. Example 1, Example 2, Example 3. Example 4 are obtained. It can be seen from FIG. 13 that the wiring patterns of Comparative Example 3 and Examples 1 to 4 all give sufficient bump share strength. Assuming that the requirement value for bump share strength is 14.2 gf, all samples listed in FIG. 13 meet this requirement value. However, in Comparative Example 2, there was a clear decrease tendency in the hump share strength as compared with Comparative Example 3 and Examples 1-4. The wiring pattern of Comparative Example 2 is thickened only by an Al layer. In Comparative Example 2, the decreased bump shear strength is considered to be caused by a thick Al—Au compound. The thick Al—Au compound may be generated from the Al layer and the Au bump, and voids and grain coarsening occur. On the other hand, in Comparative Example 3 and Examples 1 to 4, a partition layer 16 was added between the two Al layers to thicken the wiring pattern. In this case, the formation of the compound of the Al layer and the Au hump is suppressed by the partition layer. Therefore, a good bump shear strength can be obtained. Thus, by adding the partition layer as the intermediate layer of the wiring pattern, a high bump shear strength can be obtained.

Embodiment 2

Figure 14:
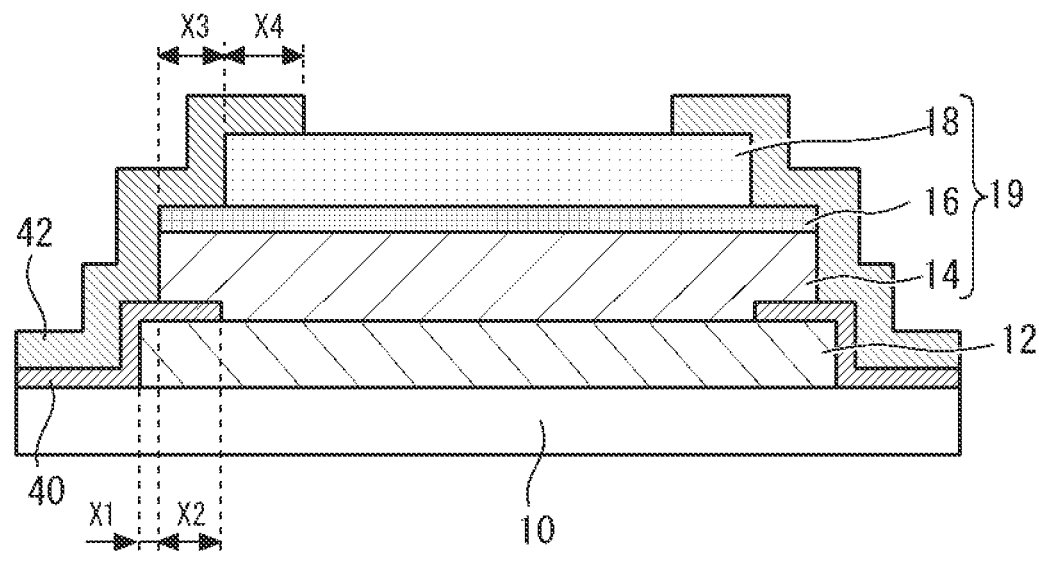
FIG. 14 is a cross-sectional view showing a configuration example of a wiring pattern.

FIG. 14 is a cross-sectional view showing a configuration example of a wiring pattern according to the Embodiment 2. A first insulating layer 40 covers a portion of the upper surface of the first wiring layer 12. The lower metal layer 14 has a portion in contact with the upper surface of the first wiring layer 12, and a portion in contact with the upper surface of the first wiring layer 12 via the first insulating layer 40. A second insulating layer 42 covers an upper surface of the first insulating layer 40 and the side surface of the second wiring layer 19. According to one example, the second insulating layer 42 exposes at least a portion of the upper surface of the upper metal layer 18.

The second wiring layer 19 of FIG. 14 is formed in a stepped shape. The second insulating layer 42 covers the stepped shape. In the example of FIG. 14, the first wiring layer 12 is not in direct contact with the second insulating layer 42. The second wiring layer 19 is in direct contact with the first wiring layer 12, the first insulating layer 40 and the second insulating layer 42. The first insulating layer 40 is in direct contact with the first wiring layer 12, the second wiring layer 19 and the second insulating layer 42. Thus, the wiring pattern of FIG. 14 is covered by the first insulating layer 40 and the second insulating layer 42. According to an example, a thermal expansion coefficient of the first insulating layer 40 can be made smaller than a thermal expansion coefficient of the second insulating layer 42. As a result of this, peeling of the second insulating layer 42 can be suppressed.

A width X1 shown in FIG. 14 is the difference in width of the first wiring layer 12 and the lower metal layer 14. The width X1 is, for example, 1.5 μm. A width X2 is the overlapping width of the first insulating layer 40 and the lower metal layer 14. The width X2 is, for example, 2.0 μm. A width X3 is the overlapping width of the second insulating layer 42 and the partition layer 16. The width X3 is, for example, 2.0 μm. A width X4 is the overlapping width of the second insulating layer 42 and the upper metal layer 18, The width X4 is, for example, 2.0 μm.

Figure 15:
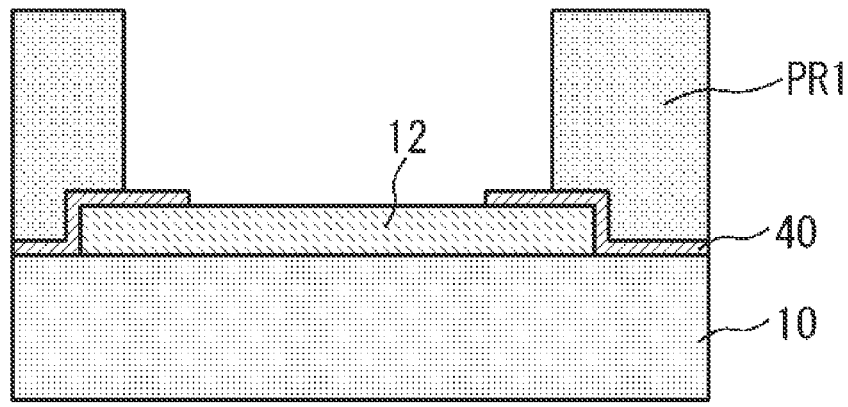
FIG. 15 shows a method for manufacturing the wiring pattern.

A method of manufacturing the wiring pattern according to the Embodiment 2 will be described with reference to FIGS. 15-20. First, the first wiring layer 12 is patterned to form the first insulating layer 40. Next, as shown in FIG. 15, a first photo-resist PR1 is formed. The first photoresist PR1 exposes a portion of the first insulating layer 40 and a portion of the first wiring layer 12.

Figure 16:
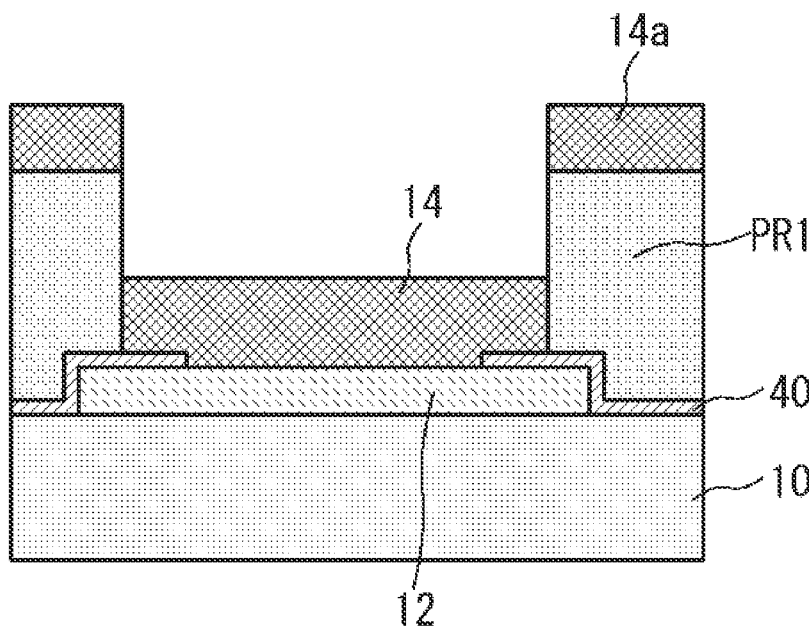
FIG. 16 shows a method for manufacturing the wiring pattern.

Next, the lower metal layer 14 is formed. FIG. 16 is a cross-sectional view showing that the lower metal layer 14 is formed. According to one example, the lower metal layer 14 includes a Ti layer and a AlCu layer formed over the Ti layer. For example, the thickness of the Ti layer is 100 nm, and the thickness of the AlCu layer is 1500 nm. With the formation of the lower metal layer 14, a metal layer 14*a* is also formed on the first photo-resist PR1.

Figure 17:
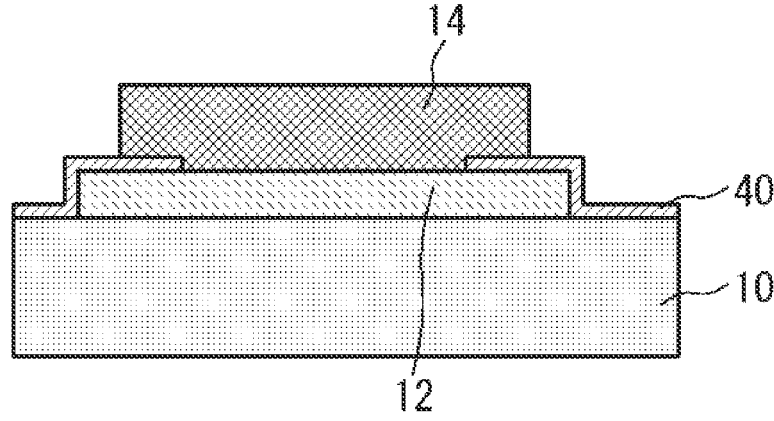
FIG. 17 shows a method for manufacturing the wiring pattern.
Figure 18:
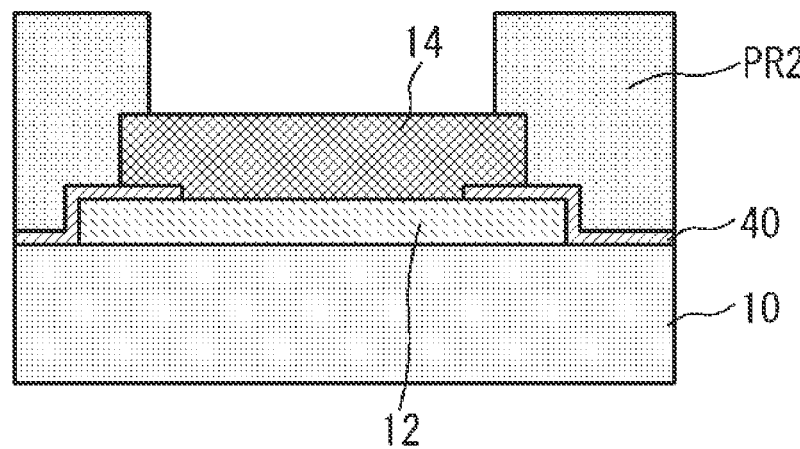
FIG. 18 shows a method for manufacturing the wiring pattern.

Next, a first lift-off process is performed. As a result, the first photo-resist PR1 and the metal layer 14*a* are removed. FIG. 17 is a cross-sectional view after the first lift-off process. Next, a second photo-resist is formed. FIG. 18 is a diagram showing the second photo-resist PR2. The second photo-resist PR2 exposes a portion of the lower metal layer 14.

Figure 19:
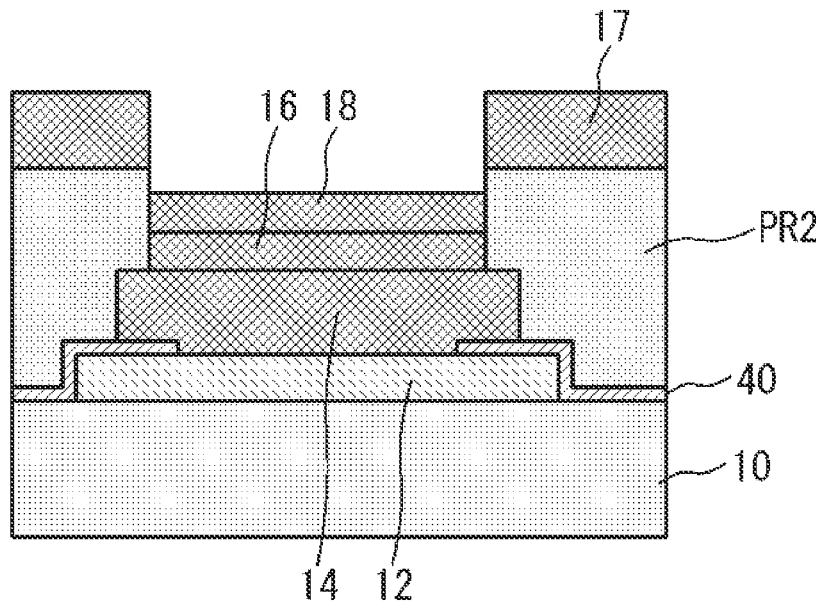
FIG. 19 shows a method for manufacturing the wiring pattern.

Next, the partition layer 16 and the upper metal layer 18 are formed. FIG. 19 is a view showing that the partition layer 16 and the upper metal layer 18 are formed. According to one example, the partition layer 16 is a Ti layer having a thickness of 100 nm, and the upper metal layer 18 is a AlCu layer having a thickness of 1500 nm. With the for formation of the partition layer 16 and the upper metal layer 18, a metal layer 17 is formed on the second photo-resist PR2.

Figure 20:
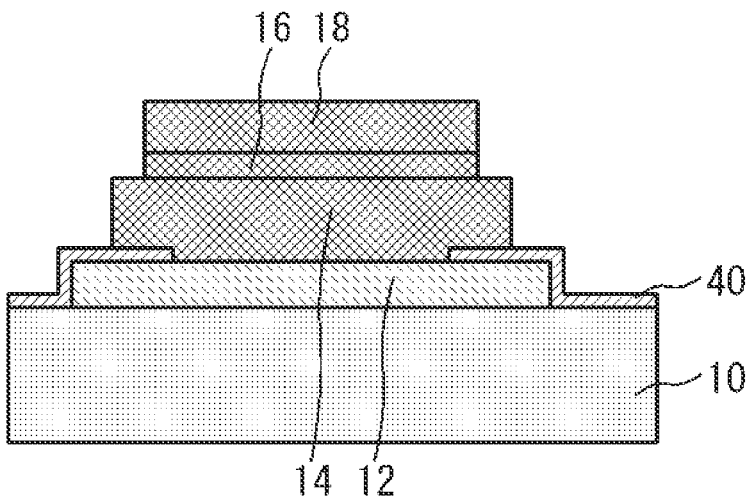
FIG. 20 shows a method for manufacturing the wiring pattern.

Next, a second lift-off process is performed. As a result, the second photo-resist PR2 and the metal layers 17 are removed. FIG. 20 is a cross-sectional view after the second lift-off process. Next, the second insulating layer 42 is formed as necessary. According to this manufacturing method, a width of the partition layer 16 matches a width of the upper metal layer 18. According to another example, as shown in FIG. 14, a width of the partition layer 16 and a width of the lower metal layer 14 may coincide with each other.

Embodiment 3

Figure 21:
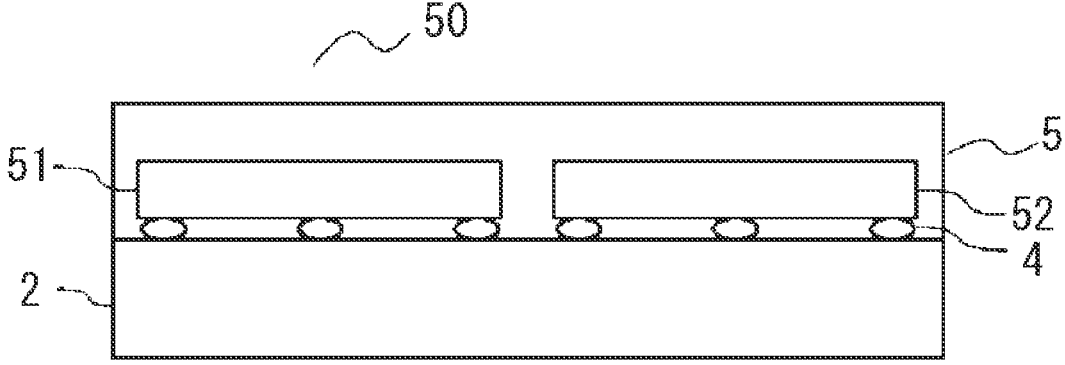
FIG. 21 is a cross-sectional view of an elastic wave device.

FIG. 21 is a longitudinal cross-sectional view of an elastic wave device according to the Embodiment 3. As shown in FIG. 21, an elastic wave device 50 comprises a first device chip 51 and a second device chip 52. According to an example, the first device chip 51 and the second device chip 52 function as a band-pass filter. For example, the first device chip 51 functions as one of a transmission filter and a receiving filter. The second device chip 52 functions as the other of the transmission filter and the receiving filter.

The first device chip 51 and the second device chip 52 can have substantially the same configuration as the device chip 3 of the Embodiment 1. The first device chip 51 includes, for example, the plurality of elastic wave elements 30 of the Embodiment 1. Specifically, the first device chip 51 can include a band-pass filter made of a plurality of surface acoustic wave resonators. The second device chip 52 includes, for example, the plurality of elastic wave elements 30 of the Embodiment 1. Specifically, the second device chip 52 can includes a band-pass filter made of a plurality of surface acoustic wave resonators.

According to another example, the second device chip 52 includes elastic wave elements different from that of Embodiment 1. Specifically, the second device chip 52 may have a band-pass filter made of a plurality of acoustic thin film resonators.

Figure 22:
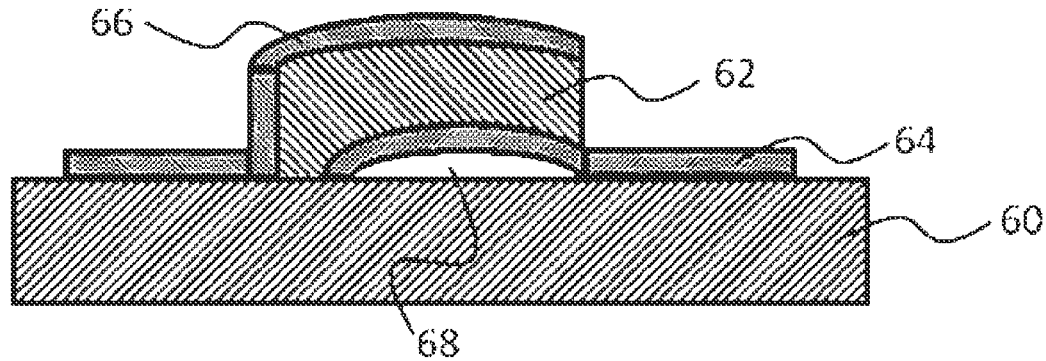
FIG. 22 shows an example of an acoustic thin film resonator.

FIG. 22 shows an example in which the elastic wave element of the second device chip 52 is an acoustic thin film resonator. In FIG. 22, the second device chip 52 includes a chip substrate 60. The chip substrate 60 is, for example, a semiconductor substrate such as silicon, or an insulating substrate such as sapphire, alumina, spinel or glass. A piezoelectric film 62 is provided on the chip substrate 60. The piezoelectric film 62 is formed of, for example, aluminum nitride. A lower electrode 64 and an upper electrode 66 are provided so as to sandwich the piezoelectric film 62. The lower electrode 64 and the upper electrode 66 are formed of a metal such as ruthenium, for example. An air gap 68 is a space between the lower electrode 64 and the chip substrate 60. In the acoustic thin film resonator, the lower electrode 64 and the upper electrode 66 excite an elastic wave having a thickness longitudinal vibration mode inside the piezoelectric film 62. In this case, the second device chip 52 has a plurality of resonators, and the resonators function as an acoustic thin film resonator. The second device chip 52 may function as a bandpass filter or a duplexer.

According to the Embodiment 3 described above, a bandpass filter made of a plurality of surface acoustic wave resonators can be formed in the second device chip 52. Further, a band-pass filter made of a plurality of acoustic thin film resonators can be formed in the second device chip 52. The aforementioned wiring pattern may be employed in both the first device chip 51 and the second device chip 52.

Embodiment 4

Figure 23:
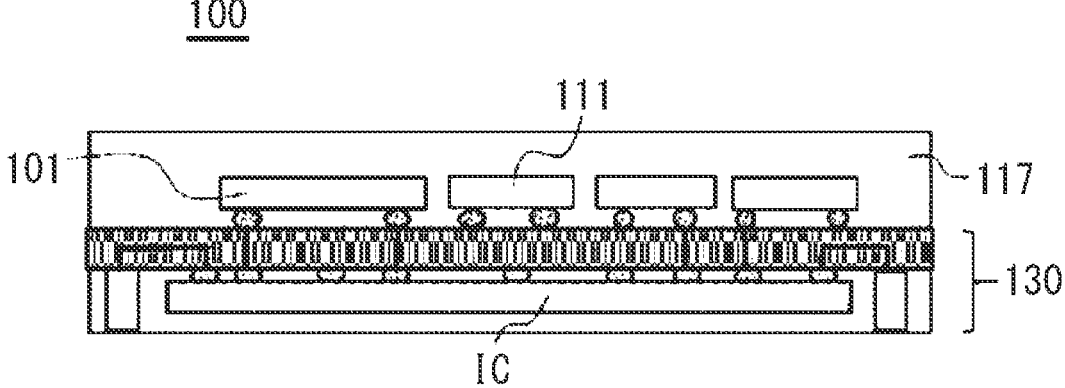
FIG. 23 is a cross-sectional view of a module having an elastic wave device.

FIG. 23 is a longitudinal cross-sectional view of a module 100 having an elastic wave device. The module 100 includes a wiring board 130, an integrated circuit component IC, an elastic wave device 101, an inductor 111, and a sealing portion 117. According to an example, the wiring board 130 can be equivalent to the wiring board 2 described in the Embodiment 1. The integrated circuit component IC is mounted inside the wiring board 130. According to one example, the integrated circuit component IC includes a switching circuit and a low noise amplifier.

The elastic wave device 101 is mounted on the main surface of the wiring board 130. As the elastic wave device 101, any of the several elastic wave devices described above can be employed. That is, the wiring pattern of the elastic wave device 101 includes the partition layer 16.

The inductor 111 is mounted on the main surface of the wiring board 130. The inductor 111 is mounted for impedance matching. For example, the inductor 111 may be an Integrated Passive Device (IPD). The sealing portion 117 seals a plurality of electronic components including the elastic wave device 101.

While several aspects of at least one embodiment have been described, it is to be understood that various modifications and improvements will readily occur to those skilled in the art. Such modifications and improvements are intended to be part of the present disclosure and are intended to be within the scope of the present disclosure.

It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners.

Specific implementations are given here for illustrative purposes only and are not intended to be limiting.

The phraseology and terminology used in the present disclosure are for the purpose of description and should not be regarded as limiting. The use of "including," "comprising," "having," and variations thereof herein means the inclusion of the items listed hereinafter and equivalents thereof, as well as additional items.

The reference to "or" may be construed so that any term described using "or" may be indicative of one, more than one, and all of the terms of that description.

References to front, back, left, right, top, bottom, and side are intended for convenience of description. Such references are not intended to limit the components of the present disclosure to any one positional or spatial orientation. Accordingly, the foregoing description and drawings are by way of example only.

The invention claimed is:

1. An elastic wave device, comprising:
a wiring board;
a device chip having a resonator, and a wiring pattern electrically connected to the resonator, wherein the device chip is electrically connected to the wiring board; and
a sealing portion that seals the device chip, wherein the wiring pattern includes a first wiring layer and a second wiring layer, the second wiring layer includes a lower metal layer in contact with an upper surface of the first wiring layer,
a partition layer which is a metal layer in contact with an upper surface of the lower metal layer, and an upper metal layer in contact with an upper surface of the partition layer,
the partition layer is a metal having a lower electrical conductivity than the lower metal layer and the upper metal layer, and
the second wiring layer has a stepped shape throughout its entire area.

2. The elastic wave device according to claim 1, wherein a total thickness of the lower metal layer and the upper metal layer is 6 to 70 times a thickness of the first wiring layer.

3. The elastic wave device according to claim 1, further comprising a first insulating layer that covers a portion of the upper surface of the first wiring layer, wherein the lower metal layer has a portion in contact with the upper surface of the first wiring layer, and a portion in contact with the upper surface of the first wiring layer via the first insulating layer.

4. The elastic wave device according to claim 3, further comprising a second insulating layer that covers an upper surface of the first insulating layer and a side surface of the second wiring layer.

5. The elastic wave device according to claim 4, wherein the second insulating layer covers the stepped shape.

6. The elastic wave device according to claim 4, wherein the first wiring layer is not in direct contact with the second insulating layer.

7. The elastic wave device according to claim 4, wherein the second wiring layer is in direct contact with the first wiring layer, the first insulating layer and the second insulating layer.

8. The elastic wave device according to claim 4, wherein the first insulating layer is in direct contact with the first wiring layer, the second wiring layer and the second insulating layer.

9. The elastic wave device according to claim 1, wherein a width of the second wiring layer is smaller than a width of the first wiring layer.

10. The elastic wave device according to claim 1, wherein the device chip comprises a piezoelectric substrate and a substrate connected to a lower surface of the piezoelectric substrate, wherein the resonator and the wiring pattern are formed on an upper surface of the piezoelectric substrate, and wherein the substrate is formed of sapphire, silicon, alumina, spinel, quartz, or glass.

11. The elastic wave device according to claim 1, wherein the device chip has a plurality of resonators, the plurality of resonators is-area surface acoustic wave resonators, and the device chip functions as a band-pass filter or a duplexer.

12. The elastic wave device according to claim 1, wherein the device chip has a plurality of resonators, the plurality of resonators is a plurality of acoustic thin film resonators, and the device chip functions as a band-pass filter or a duplexer.

13. An elastic wave device, comprising:
a wiring board;
a device chip having a resonator, and a wiring pattern electrically connected to the resonator, wherein the device chip is electrically connected to the wiring board; and
a sealing portion that seals the device chip,
wherein the wiring pattern includes a first wiring layer and a second wiring layer, the second wiring layer includes a lower metal layer in contact with an upper surface of the first wiring layer,
a partition layer which is a metal layer in contact with an upper surface of the lower metal layer, and an upper metal layer in contact with an upper surface of the partition layer,
the partition layer is a metal having a lower electrical conductivity than the lower metal layer and the upper metal layer,
the first wiring layer has a structure in which a Ti layer, an AlCu layer and a Ti layer are stacked in the order presented, the lower metal layer has a structure in which a Ti layer and an Al layer are stacked in the order presented, the partition layer is made of Ti, and the upper metal layer is made of Al.

14. The elastic wave device according to claim 1, wherein the partition layer is a metal having an electrical conductivity of $10 \times 10^6$ S/m or less, and
the lower metal layer and the upper metal layer include a metal having an electrical conductivity of $20 \times 10^6$ S/m or more.

15. A module comprising the elastic wave device according to claim 1.

* * * * *